(12) United States Patent
Yamauchi

(10) Patent No.: US 6,301,595 B1
(45) Date of Patent: Oct. 9, 2001

(54) DIGITAL FILTER

(75) Inventor: Hirofumi Yamauchi, Kitakatsuragi-gun (JP)

(73) Assignee: Icom Incorporated, Osaka (JP)

( * ) Notice: Subject to any disclaimer, the term of this patent is extended or adjusted under 35 U.S.C. 154(b) by 0 days.

(21) Appl. No.: 09/265,421

(22) Filed: Mar. 10, 1999

(30) Foreign Application Priority Data

Mar. 10, 1998 (JP) .................................................. 10-058451

(51) Int. Cl.[7] ...................................................... G06F 17/10
(52) U.S. Cl. ................................................................ 708/306
(58) Field of Search ..................................... 708/306, 320

(56) References Cited

U.S. PATENT DOCUMENTS

| | | | |
|---|---|---|---|
| 3,749,895 | * | 7/1973 | Kao ....................................... 708/306 |
| 4,920,507 | * | 4/1990 | Takeda .................................. 708/306 |
| 5,148,382 | * | 9/1992 | Kishi ..................................... 708/306 |
| 5,894,428 | * | 4/1999 | Harada ................................. 708/306 |

FOREIGN PATENT DOCUMENTS

| | | |
|---|---|---|
| 56-176528 | 5/1981 | (JP) . |
| 5-110384 | 4/1993 | (JP) . |
| 5-90900 | 4/1993 | (JP) . |

* cited by examiner

*Primary Examiner*—David H. Malzahn
(74) *Attorney, Agent, or Firm*—Wenderoth, Lind & Ponack, L.L.P.

(57) ABSTRACT

The object of the invention is to provide a technique of preventing the limit cycle, with a simplified structure, for the IIR digital filter adopting arithmetic operation part of finite word length. A digital filter shown in FIG. 1 includes an extracting means 2 to extract only 2 bits at a low end of an input signal S1 and to output the extracted signal; an amplifying means 3 to amplify the extracted signal at an amplitude level to a level larger than a critical input level of an IIR digital filter 1 and output the extracted signal as amplified; and an adding means 4 to add the input signal S1 and the extracted signal S3 as amplified and input them into the IIR digital filter 1.

16 Claims, 3 Drawing Sheets

Fig.3 high end ← → low end

S1 | X | X | X | X | X | X | X | X | X | X | X | X | X | X | a | b |

D | 0 | 0 | 0 | 0 | 0 | 0 | 0 | 0 | 0 | 0 | 0 | 0 | 0 | 0 | 1 | 1 | logical AND ⇓ (S1·D)

| S2 | 0 | 0 | 0 | 0 | 0 | 0 | 0 | 0 | 0 | 0 | 0 | 0 | 0 | 0 | a | b | shifted to left (multiplied by2) ⇩

| | 0 | 0 | 0 | 0 | 0 | 0 | 0 | 0 | 0 | 0 | 0 | 0 | 0 | a | b | 0 | shifted to left (multiplied by2) ⇩

| | 0 | 0 | 0 | 0 | 0 | 0 | 0 | 0 | 0 | 0 | 0 | 0 | a | b | 0 | 0 | shifted to left (multiplied by2) ⇩

| | 0 | 0 | 0 | 0 | 0 | 0 | 0 | 0 | 0 | 0 | 0 | a | b | 0 | 0 | 0 | shifted to left (multiplied by2) ⇩

| | 0 | 0 | 0 | 0 | 0 | 0 | 0 | 0 | 0 | 0 | a | b | 0 | 0 | 0 | 0 | shifted to left (multiplied by2) ⇩

| | 0 | 0 | 0 | 0 | 0 | 0 | 0 | 0 | 0 | a | b | 0 | 0 | 0 | 0 | 0 | shifted to left (multiplied by2) ⇩

| S3 | 0 | 0 | 0 | 0 | 0 | 0 | 0 | 0 | a | b | 0 | 0 | 0 | 0 | 0 | 0 |

DIGITAL FILTER

BACKGROUND OF THE INVENTION

1. Field of the Invention

The present invention relates to a digital filter and, more particularly, to a technique to prevent the occurrence of a limit cycle in an Infinite Impulse Response (IIR) digital filter.

2. Description of the Prior Art

It is known that IIR (recursive) digital filters, the so-called limit cycle phenomenon, an oscillation component is output that is unrelated to an input signal, occurs when an amplitude level if the input signal becomes lower than a certain input level (which is called a critical input level). The amplitude level of the output at that time is called a dead band amplitude level.

When the limit cycle occurs, the oscillation component unrelated to the input signal is output, which is observed as a kind of an oscillation phenomenan. The oscillation component may cause a malfunction of a unit disposed after a section of the digital filter. In the case of voice communication systems, the oscillation component gives an unnatural impression to recivers.

In addition, since a kind of oscillation signal is output where the limit cycle occurs, it is sometimes difficult to discriminate between a target signal and the oscillation signal caused by the limit cycle when the signal is processed at a unit disposed after a section of the digital filter.

It is thought that this limit cycle phenomenon is caused partly by an aritmethic operation part of the digital filter that adopts a finite word length. It is also known that increasing arithmetic word length, i.e. reducing quantizing steps, make it possible to reduce the dead band amplitude level or prevent the occurence of the limit cycle.

However, increasing the arithmetic word length in the digital filter for prevention of the limit cycle disadvantageously leads to increase in size and complexity of the digital filter.

Setting the coefficient of the digital filter at a value at which no limit cycle occurs results in imposing limitations on the characteristics of the digital filter.

In order to prevent the amplitude level of input signal of the digital fiber from becoming lower than the critical input level, a technique of adding a tone signal having an amplitude above the critical input level to the input signal of the digital filter is known. The addition of the tone signal can prevent the occurence of the limit cycle. However, when the frequency of the tone signal is set to be within a passband of the digital filter, it is necessary to remove the tone signal at the output side.

On the other hand, when the frequency of the tone signal is set to be within a rejection band of the digital filter, the need for removing the tone signal can be eliminated. However, in the case of the digital filter being formed in the cascade connection form, the tone signal added at the input side of the digital filter is suppressed in the 1st-stage process of the digital filter, so that it is still necessary to add tone signals thereafter, for prevention of the limit cycle. Thus, tone signal generating means are necessary for the required number of stages of the filter.

Another technique of adding a noise signal formed of random data, which is called the dither, to the input signal is also known. This technique may be used instead of adding the tone signal to the input signal. For example, Japanese Laid-open Utility Model Publication No. Sho 56 (1981)-176528 and Japanese Laid-open Patent Publications No. Hei 05 (1993)-090900 and No. Hei 5 (1993)-110384 disclose the technique of adding separately generated random data (dither) to the input signal, to prevent the occurence of the limit cycle.

The Japanese Laid-open Patent Publication No. Hei 5 (1993)-110384 discloses a technique wherein when the input signal is detected to be zero, a level of the dither to be added is increased and then the increased level of the dither is added to the input signal.

However, this technique of generating the dither separately requires an increased amount of arithmetic in an arithmetic unit, such as the CPU, thereby increasing the load on the arithmetic unit. Otherwise, additional specialized hardware may be required.

Although a signal as random as possible, like white noise, is desirable for the dither, in general, an M sequence signal is used as the artificially generated dither. The M sequence signal is used as the artificially generated dither. The M sequence signal however canoot be regarded as equivalent to white noise without extending its period to a considerable extent. In the case the period of the M sequence signal is short, a periodic component caused by the short period is included in the signal. If the frequency of the period component is within the passband of the digital filter, then it may give an unnatural impression to receivers, as is the case with the limit cycle occuring. When the period is extended to prevent this problem, there arises a problem that an amount of arithmetic in the arithmetic unit, such as the CPU, is further increased to that amount, or additional specialized hardware is required.

SUMMARY OF THE INVENTION

Accordingly, the present invention has been made, with the aim of providing the technique of preventing the limit cycle, with a simplified structure, for the IIR digital filter adopting arithmetic operation part of finite word length.

A digital filter according to the invention comprises an IIR digital filter; an extracting means to extract only a specified number of bits at a low end of an input signal and to output the extracted signal; an amplifying means to amplify the extracted signal at an amplitude level to a level larger than a critical input level in which a limit cycle occurs in the IIR digital filter and to output the extracted signal as amplified; and an adding means to add the input signal and the extracted signal as amplified and to input the added signal into the IIR digital filter.

Further, a digital filter according to the invention comprises an IIR digital filter; an extracting means to extract only a specified number of bits at a low end of an input signal and to output the extracted signal; an amplifying means to amplify the extracted signal at an amplitude level to a level larger than a critical input level in which a limit cycle occurs in the IIR digital filter and to output the extracted signal as amplified; a level comparing means to detect an amplitude level of the input signal and to compare it with the critical input level; and an adding means to add the input signal and the extracted signal as amplified and to input the added signal into the IIR digital filter, when the amplitude level of the input signal is smaller than the critical input level.

Preferably, the specified number of bits to be extracted by the extracting means should be two bits or more.

BRIEF DESCRIPTION OF THE DRAWINGS

FIG. 3 is an illustration of an operation of logical operation; and

FIG. 4 is an illustration of an operation of logical operation.

DETAILED DESCRIPTION OF THE EMBODIMENT

Figure 1:
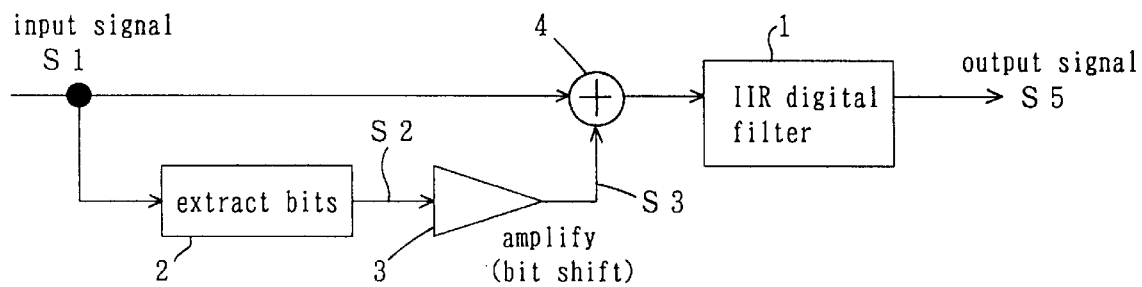
FIG. 1 is a representation showing construction of a digital filter of an embodiment of the invention.

Referring now to the accompanying drawings, examples of the preferred embodiment of the digital filter of the present invention will be described below. It is to be understood, however, that the scope of the invention is by no means limited to the illustrated embodiments.

Numeral 1 designates an IIR digital filter of 16 bits in word length (96 dB in dynamic range). The IIR digital filter 1 is assumed such that the limit cycle occurs when an amplitude level of the input signal becomes lower than −50 dB, where a full scale amplitude level is taken as 0 dB. In other words, the critical input level is set at −50 dB.

Also, an amplitude level of the residual noise included in the input signal in the IIR digital filter 1 assumes to be larger than −84 dB (2 bits at the low end).

Numeral 2 designates an extracting means which extracts only 2 bits at the low end of the input signal S1 and outputs them as a signal S2. The extract of the 2 bits at the low end is realized by the logical AND the input signal S1 and the value D in which 2 at the low end are 1 and bits at the higher end are 0, as shown in FIG. 3. Since the extracted signal S2 includes the 2 bits at the low end of the residual noise and thus has no regularly, or it can be regarded as white noise.

Numeral 3 designates an amplifying means which is set at 36 dB in gain. The amplifying means amplifies the extracted signal S2 at the amplitude level (−84 dB) by the amount of 36 dB and then outputs the amplified signal of the amplitude level of −48 dB as an extracted signal S3. The amplification by the amount of 36 dB can be realized by the signal S2 being shifted six bits to the left, as shown in FIG. 4.

Numeral 4 designates an adding means which adds the input signal S1 and the extracted signal S3 as amplified and inputs the added signal S4 into the IIR digital filter 1.

With this constructed digital filter, when the level of the target signal of the input signal S1 becomes lower than −50 dB of the critical input level, since the amplitude level of the residual noise is above 2 bits at the low end (−84 dB), the 2 bits at the low end are extracted by the logical AND of the extracting means 2 and amplified by the amount of 36 dB by the amplifying means 3, to thereby generate the extracted signal S3 of −48 dB. When the extracted signal S3 is added to the input signal S1, the level of the extracted signal S3 will be larger than the critical input level (−48 dB>−50 dB), so the occurrence of the limit cycle in the IIR digital filter is prevented.

As a result of this, a noise limited into the passband of the filter is output as the output signal S5 of the IIR digital filter 1.

In the case of voice communication systems, for example, the output in which the limit cycle occurs gives an unnatural impression to receivers because the output is the oscillation component unrelated to the input signal. However, with the construction described above, since the component outputting as the output signal S5 of the IIR digital filter 1 is the component of the white noise limited into the passband, it does not give any unnatural impression to receivers.

Since the output in which the limit cycle occurs is a kind of oscillation signal, there are instances where it is difficult to discriminate between the target signal and the oscillation signal, when the signal is processed at a unit disposed after a section of the digital filter. The addition of white noise to the input signal to prevent the limit cycle, enables discrimination between the target signal and noise with ease.

Also, even for the digital filter formed in the cascade connection form, since white noise includes the component which is in the passband of the digital filter, the limit cycle prevention signal is supplied to all stages of the digital filter. Accordingly, white noise working as the limit cycle prevention signal is simply required to be supplied to the first stage of the digital filter.

When a given amount of residual noise in the input signal of the digital filter, without the target signal being included in the input signal, components for several bits at the lower end of the digital values of the input signal will all be noise components. Thus, the pseudo white noise signal for preventing the limit cycle can be generated by extracting the data of those several bits at the lower end and amplifying them to values larger than the critical input level of the digital filter.

Even with a signal which is not a noise, e.g. a target signal, being included in the input signal, the extracted signal can be regarded as the white noise signal, because only a part (2 bits at the low end in the above case) of the input signal (16 bits in the above case) is extracted and no correlation between the extracted signal and the input signal exists. Thus, the pseudo white noise signal for preventing the limit cycle can be then generated.

If the number of low bits to be extracted is set to be two or more (2 bits in the above case), the amplitude will also be random, so that the pseudo white noise signal that is generated that is closer to real white noise.

With the method described above, the pseudo white noise signal can be generated by simply performing the logical AND operation and the bit shift operation. Thus, no special hardware is needed and also little amount of arithmetic operation is simply required.

Although illustrated in the above embodiment, wherein the pseudo white noise signal is being added at all times, such is not needed. Since the limit cycle does not occur until after the input signal becomes lower than the critical input level, when the input signal has a larger level than the critical input level, the addition of the pseudo white noise to the input signal may be stopped. This manner of operation improves a signal-to-noise ratio of the output signal of the digital filter.

Figure 2:
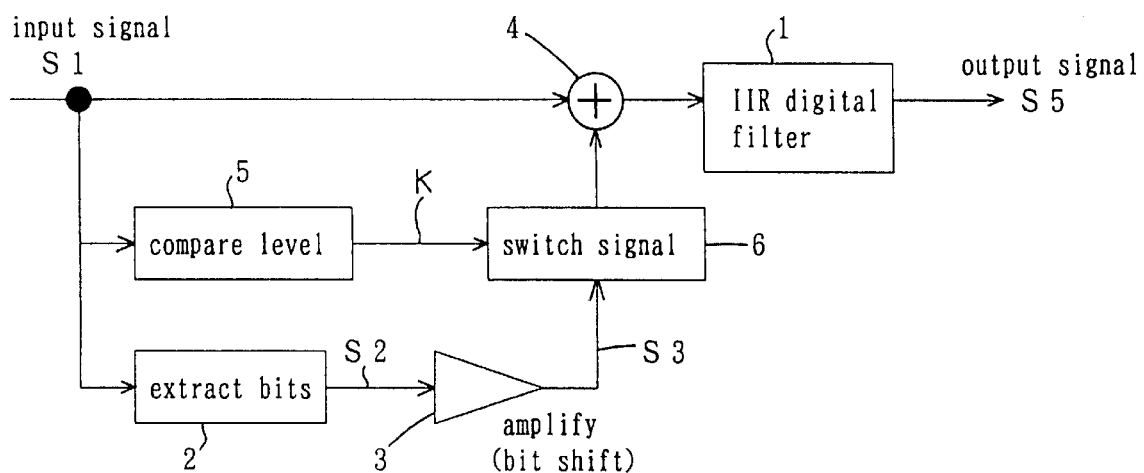
FIG. 2 is a representation showing construction of a digital filter of another embodiment of the invention.

FIG. 2 illustrates a modified embodiment that provides a level comparing means, which compares an amplitude level of an input signal with the critical input level. In accordance with this embodiment, when the input signal has a larger level than the critical input level, the pseudo white noise signal is not added to the input signal.

In FIG. 2, the construction indicated by the reference numerals 1–4 are the same as the construction shown in FIG. 1.

Numeral 5 designates the level comparing means which detects an amplitude level of the input signal S1 and compares it with a comparison level which is set to be slightly larger than the critical input level. When the amplitude level of the input signal S1 is smaller than the comparison level, the level comparing means outputs an addition command K to add the pseudo white noise signal to the input signal S1.

Numeral 6 designates a signal switching means for switching signal to be output to the adding means 4 between the extracted signal S3 as amplified and a signal of a zero value on the basis of the addition command K. Specifically, the signal switching means 6 is adapted to output the extracted signal S3 as amplified to the adding means 4 when it receives the addition command K, and output the signal of zero value, instead of the extracted signal, to the adding means when it does not receive the addition command K.

In the embodiment of FIG. 2, the adding means includes the adding means 4 and the signal switching means 6.

The embodiment of FIG. 2 thus constructed includes the level comparing means 5 which compares an amplitude level of the input signal S1 with the comparison level, so that, when the amplitude level of the input signal S1 is larger than the critical input level, the extracted signal as the pseudo white noise signal can be prevented from being output to the adding means 4. Thus, the signal-to-noise ratio of the output signal S5 of the digital filter is improved.

Although the extracting means and the amplifying means are realized by the logical arithmetic operation in the embodiments illustrated above, those means may be realized by circuits in hardware.

Also, the number of bits to be extracted are not limited to 2 bits.

What is claimed is:

1. A digital filter comprising:
an IIR digital filter;
an extracting means to extract a signal comprising only a specified number of bits at a low end of an input signal, and to output the extracted signal;
an amplifying means to amplify the extracted signal at an amplitude level to a level larger than a critical input level in which a limit cycle occurs in the IIR digital filter and to output the extracted signal as amplified; and
an adding means to add the input signal and the extracted signal as amplified and to input the added signal into the IIR digital filter.

2. A digital filter according to claim 1, wherein the amplifying means comprises a means to amplify the specified number of extracted bits by a bit shift operation.

3. A digital filter according to claim 1, wherein the specified number of bits to be extracted by the extracting means is two bits or more.

4. A digital filter according to claim 3, wherein the amplifying means comprises a means to amplify the specified number of extracted bits by a bit shift operation.

5. A digital filter according to claim 1, wherein the extracting means comprises a means to extract the specified number of bits at the low end by logical AND of the input signal and the data in which the specified number of bits at the low end are 1 and remaining bits at the higher end are 0.

6. A digital filter according to claim 5, wherein the amplifying means comprises a means to amplify the specified number of extracted bits by a bit shift operation.

7. A digital filter according to claim 5, wherein the specified number of bits to be extracted by the extracting means is two bits or more.

8. A digital filter according to claim 7, wherein the amplifying means comprises a means to amplify the specified number of extracted bits by a bit shift operation.

9. A digital filter comprising:
an IIR digital filter;
an extracting means to extract a signal comprising only a specified number of bits at a low end of an input signal, and to output the extracted signal;
an amplifying means to amplify the extracted signal at an amplitude level to a level larger than a critical input level in which a limit cycle occurs in the IIR digital filter and to output the extracted signal as amplified;
a level comparing means to detect an amplitude level of the input signal and to compare it with the critical input level; and
an addingmeans to add the input signal and the extracted signal as amplified and to input the added signal into the IIR digital filter, when the amplitude level of the input signal is smaller than the critical input level.

10. A digital filter according to claim 9, wherein the amplifying means comprises a means to amplify the specified number of extracted bits by a bit shift operation.

11. A digital filter according to claim 9, wherein the specified number of bits to be extracted by the extracting means is two bits or more.

12. A digital filter according to claim 11, wherein the amplifying means comprises a means to amplify the specified number of extracted bits by a bit shift operation.

13. A digital filter according to claim 9, wherein the extracting means comprises a means to extract the specified number of bits at the low end by logical AND of the input signal and the data in which the specified number of bits at the low end are 1 and remaining bits at the higher end are 0.

14. A digital filter according to claim 13, wherein the amplifying means comprises a means to amplify the specified number of extracted bits by a bit shift operation.

15. A digital filter according to claim 13, wherein the specified number of bits to be extracted by the extracting means is two bits more.

16. A digital filter according to claim 15, wherein the amplifying means comprises a means to amplify the specified number of extracted bits by a bit shift operation.

* * * * *

UNITED STATES PATENT AND TRADEMARK OFFICE
CERTIFICATE OF CORRECTION

PATENT NO. : 6,301,595 B1
DATED : October 9, 2001
INVENTOR(S) : Hirofumi Yamauchi It is certified that error appears in the above-identified patent and that said Letters Patent is hereby corrected as shown below:

ABSTRACT OF THE DISCLOSURE

The object of the invention is to provide a technique of preventing the limit cycle, with a simplified structure, for the IIR digital filter adopting an arithmetic operation part of finite word length. A digital filter includes an extractor to extract only 2 bits at a low end of an input signal and to output the extracted signal; an amplifier to amplify the extracted signal at an amplitude level to a level larger than a critical input level of an IIR digital filter and output the extracted signal as amplified; and an adder to add the input signal and the extracted signal as amplified and input them into the IIR digital filter.

Signed and Sealed this

Nineteenth Day of March, 2002

Attest:

Attesting Officer

JAMES E. ROGAN
Director of the United States Patent and Trademark Office